United States Patent [19]
Inada et al.

[11] Patent Number: 5,420,062
[45] Date of Patent: May 30, 1995

[54] METHOD OF MANUFACTURING AN INSULATED GATE FET HAVING DOUBLE-LAYERED WELLS OF LOW AND HIGH IMPURITY CONCENTRATIONS

[75] Inventors: Nakfumi Inada; Osamu Takata, both of Yokohama, Japan

[73] Assignee: Kabushiki Kaisha Toshiba, Kawasaki, Japan

[21] Appl. No.: 230,870

[22] Filed: Apr. 20, 1994

Related U.S. Application Data

[60] Division of Ser. No. 24,114, Feb. 23, 1993, abandoned, which is a continuation of Ser. No. 700,263, May 15, 1991, abandoned.

[51] Int. Cl.$^6$ ............................................. H01L 21/70
[52] U.S. Cl. ....................................... 437/57; 437/27; 437/34; 437/40; 437/913
[58] Field of Search .................. 357/48, 23.3, 23.4, 357/23.8, 42; 257/409; 437/27, 34, 57

[56] References Cited

U.S. PATENT DOCUMENTS

| | | | |
|---|---|---|---|
| 3,925,120 | 12/1975 | Saida et al. | 357/23.11 |
| 4,070,687 | 1/1978 | Ho et al. | 357/54 |
| 4,626,882 | 12/1986 | Cottrell et al. | 357/48 |
| 4,968,639 | 11/1990 | Bergonzoni | 357/23.8 |
| 4,969,030 | 11/1990 | Musumeci et al. | 357/48 |
| 4,979,001 | 12/1990 | Alter | 357/48 |
| 5,015,598 | 5/1991 | Verhaar | 357/23.3 |
| 5,061,649 | 10/1991 | Takenouchi et al. | 357/23.3 |
| 5,238,860 | 8/1993 | Sawada et al. | 437/47 |

OTHER PUBLICATIONS

Patent Abstracts of Japan vol. 4 No. 121 (E-23) (603) Aug. 27, 1980 JPA 55 077169 published Jun. 10, 1980 to Hitami Seisakusho K.K.
Patent Abstracts of Japan vol. 12, No. 403 (E-674)(3250) Oct. 26, 1988: JP-A-63 144559 published Jun. 16, 1988 to Toshiba Corp.
IBM Technical Disclosure Bulletin, vol. 32, No. 9A, Feb. 1990, "Low-Threshold Short-Channel Mosfet with Punch-Through Protection".
Patent Abstracts of Japan vol. 5, No. 167 (E-79)(839) Oct. 24, 1981: JP-A-096853 published Aug. 5, 1981 to Hitachi Seisakusho K.K.
Patent Abstracts of Japan vol. 9, No. 291 (E-359)(2014) Nov. 19, 1985: JP-A-60 132358 published Jul. 15, 1985 to Nippon Denki K.K.
Lance A. Glasser and Daniel W. Dobberpuhl, "The Design and Analysis of VLSI Circuit," Addison-Wesley Publishing Company, Chpt. 2, pp. 122-129, 1985.
Neil H. E. Weste and Kamran Eshraghian, "Principles of CMOS VLSI Design, A Systems Perspective," Addison-Wesley Publishing Company, Chpt. 2, pp. 58-60, 1985.

*Primary Examiner*—Brian Hearn
*Assistant Examiner*—Michael Trinh
*Attorney, Agent, or Firm*—Finnegan, Henderson Farabow, Garrett & Dunner

[57] ABSTRACT

This invention relates to an insulated gate FET in which the withstanding voltage and the latch-up resistant property are both made high. The structure thereof includes a second well formed in a first well and having an impurity concentration lower than that of the first well. Source and drain electrodes of the FET are formed in the second well.

6 Claims, 8 Drawing Sheets

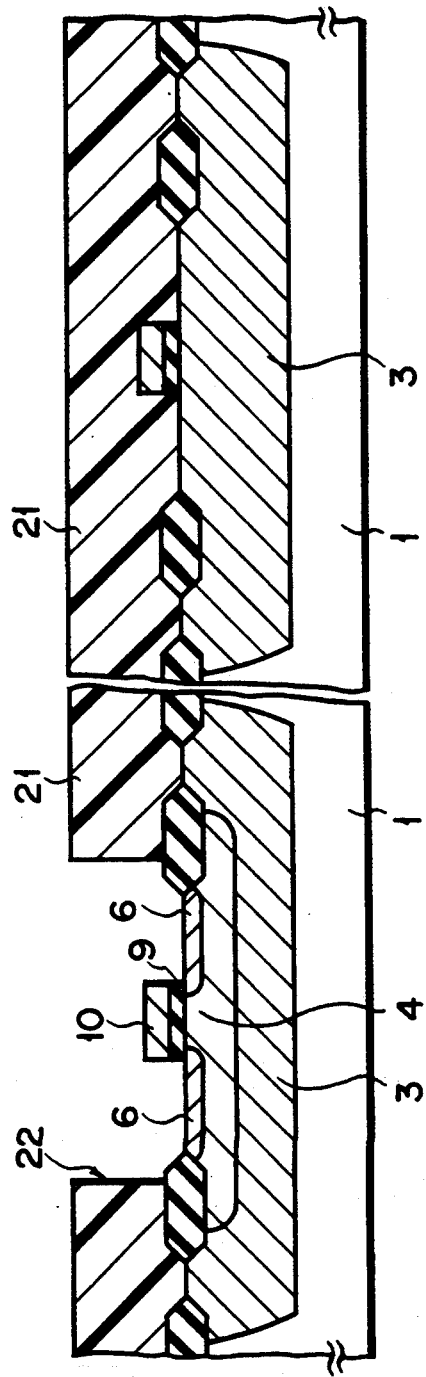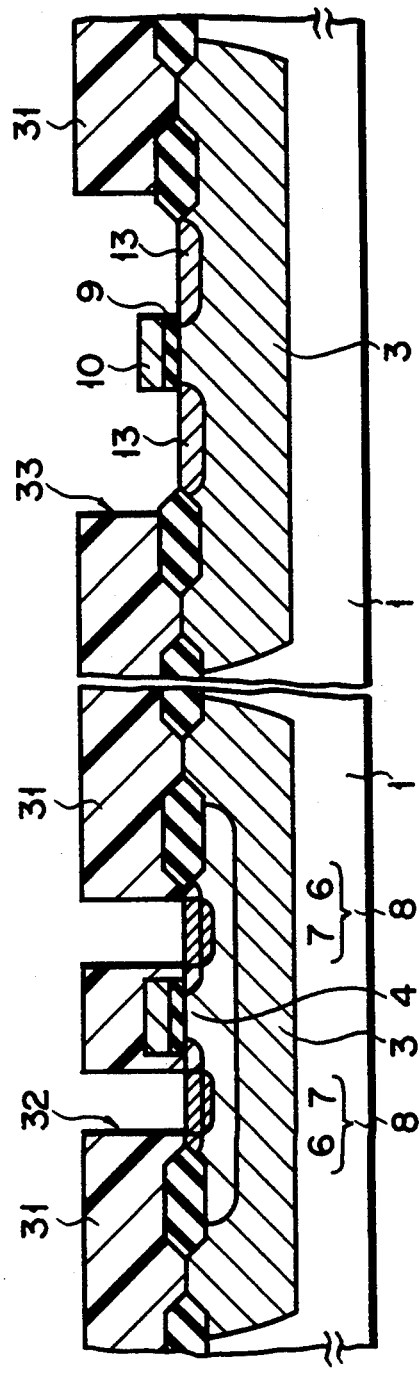
FIG. 5E
FIG. 5F

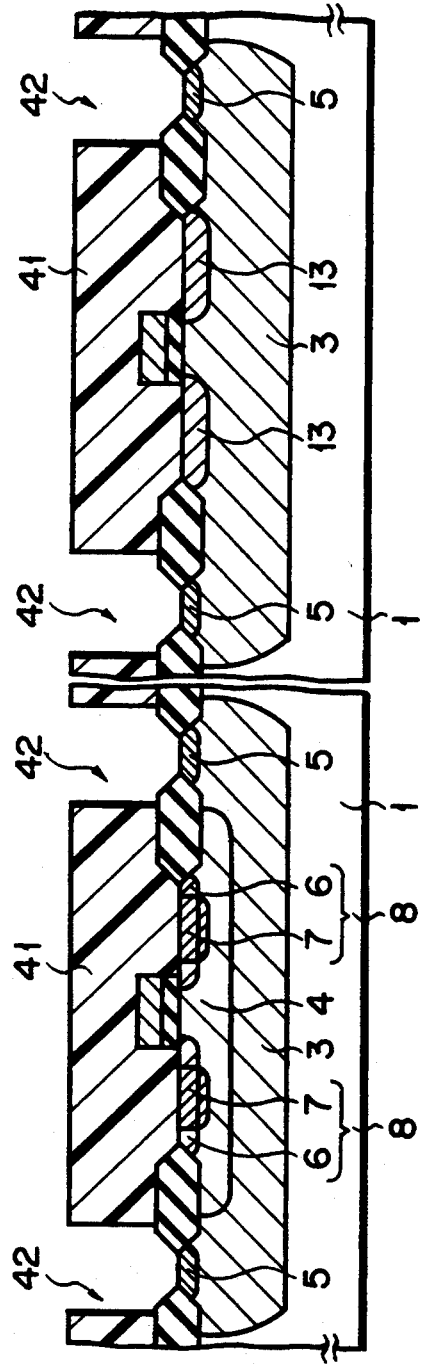
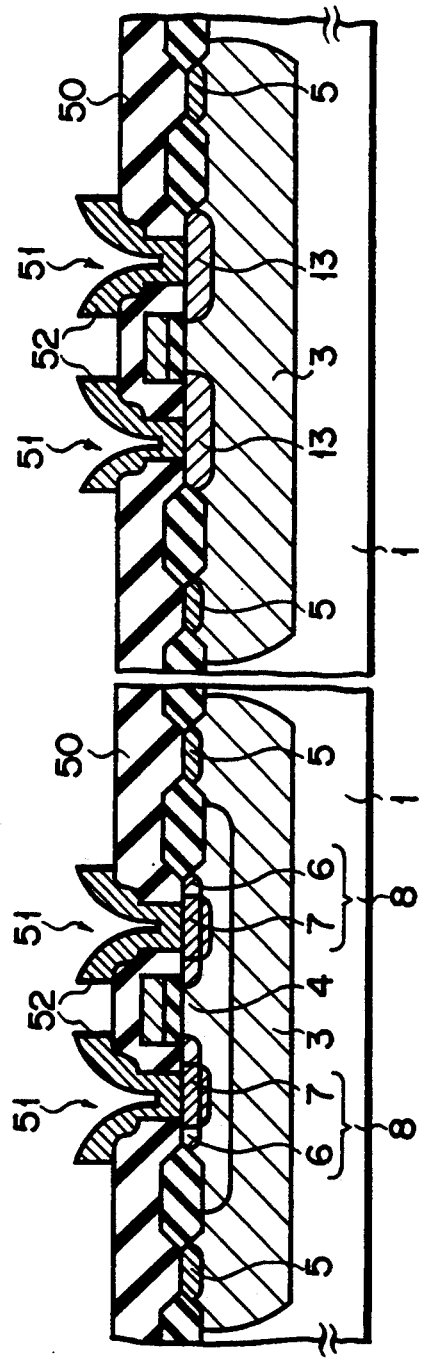
FIG. 5G
FIG. 5H

METHOD OF MANUFACTURING AN INSULATED GATE FET HAVING DOUBLE-LAYERED WELLS OF LOW AND HIGH IMPURITY CONCENTRATIONS

This application is a division of application Ser. No. 08/024,114, filed Feb. 23, 1993, now abandoned, which in turn, is a continuation of application Ser. No. 07/700,263, filed May 15, 1991, now abandoned.

BACKGROUND OF THE INVENTION

1. Field of the Invention

This invention relates to an insulated gate FET and a method for manufacturing the same, and more particularly to the improvement of a withstanding voltage and latch-up characteristic.

2. Description of the Related Art

At present, semiconductor devices have a problem that a parasitic bipolar transistor will be rendered conductive, that is, a so-called latch-up phenomenon may occur.

In order to prevent occurrence of the latch-up phenomenon, there is provided a method of lowering the performance of the parasitic bipolar transistor by separating the elements from each other by a sufficiently long distance to increase the base length of the parasitic bipolar transistor, for example.

However, recently, the distance between the elements is gradually reduced with an increase in the integration density of the semiconductor device. When the distance between the elements is gradually reduced, the base length of the parasitic bipolar transistor is reduced, thereby permitting the parasitic bipolar transistor to be easily turned on.

In order to solve the above problem, there is provided a method of lowering the performance of the parasitic bipolar transistor by increasing the impurity concentration of the well region to enhance the base impurity concentration of the parasitic bipolar transistor.

Further, the element itself has been miniaturized, and a problem of short channel effect and the like tends to occur. In order to prevent the short channel effect, there is provided a method of lowering the intensity of the electric field near the gate electrode by lowering the drain impurity concentration near the gate electrode, for example. As the above method, several methods using an LDD (Lightly Doped Drain) structure, GDD (Graded Diffused Drain) structure, DDD (Double Diffused Drain) structure and the like are known.

Generally, active elements constituting an IC are operated on a voltage of approx. 5 V, but some elements are operated on a higher voltage of 10 V or more (this type of element is hereinafter referred to as a high voltage element in this specification).

Since a high voltage is applied to the gate, drain and source in the high voltage element, the short channel effect which tends to occur in the miniaturized element may be caused even if the gate length is sufficiently large, for example. In order to solve the above problem, The above-described LDD structure, GDD structure and DDD structure are incorporated into the high voltage element.

Thus, the high voltage element has been miniaturized. Therefore, recently, a latch-up phenomenon has become significant as a problem. However, in the high voltage element, the withstanding voltage of the element will be lowered if the impurity concentration of the well region is enhanced to improve the latch-up resistant property.

SUMMARY OF THE INVENTION

This invention has been made in view of the above problems, and an object of this invention is to provide an insulated gate FET having a high withstanding voltage and a high latch-up resistant property and a method of manufacturing the same.

In order to attain the above object, an insulated gate FET of this invention is constructed as follows:

A semiconductor device comprises:
- a semiconductor substrate of a conductivity type having a main surface;
- a first well of a second conductivity type formed in the main surface area of the semiconductor substrate;
- a second well of the same conductivity type as that of the first well formed in the surface area of the first well and having an impurity concentration lower than that of the first well;
- a source electrode and a drain electrode of the first conductivity type formed in the surface area of the second well; and
- a gate electrode formed over that portion of the main surface area of the semiconductor substrate which lies between the source electrode and the drain electrode with an insulation film disposed between the gate electrode and the main surface area of the semiconductor substrate.

Further, a method for manufacturing the above device is constructed as follows:

A semiconductor device manufacturing method comprises the steps of:
- diffusing impurity of a second conductivity type into a semiconductor substrate of a first conductivity type to form a first well of the second conductivity type;
- doping impurity ions of the first conductivity type into the first well to reduce the concentration of impurity of the second conductivity type in the first well, thus forming a second well of the second conductivity type having an impurity concentration lower than that of the first well in the first well;
- forming a gate insulation film on the second well;
- forming a gate electrode on the gate insulation film; and
- doping impurity of the first conductivity type into the second well with the gate electrode used as a mask and forming source and drain electrodes in the second well.

According to the insulated gate FET with the above construction, since the impurity concentration of the second well in which the source and drain electrodes are formed is lowered, the surface breakdown voltage between the source/drain electrode and the well can be enhanced.

Further, since the impurity concentration of a portion near a current path formed to extend from the source electrode to the drain electrode via a channel is lowered and the second well is surrounded by the first well having an impurity concentration higher than that of the second well, the latch-up resistant property can be enhanced.

Further, according to the semiconductor device manufacturing method, impurity of the first conductivity type is doped into the first well of the second conductivity type. In a region in which the impurity of the first conductivity type is doped, combination of donors and acceptors occurs, thereby partly lowering the impurity concentration. As a result, the second well of the impurity concentration which is lower than that of the first well of the second conductivity type can be formed in the first well.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5A to 5H are cross sectional views showing a method of manufacturing the MOSFET according to the first embodiment of this invention;

DETAILED DESCRIPTION OF THE PREFERRED EMBODIMENTS

There will now be described an embodiment of this invention with reference to the accompanying drawings.

[First Embodiment]

Figure 1:
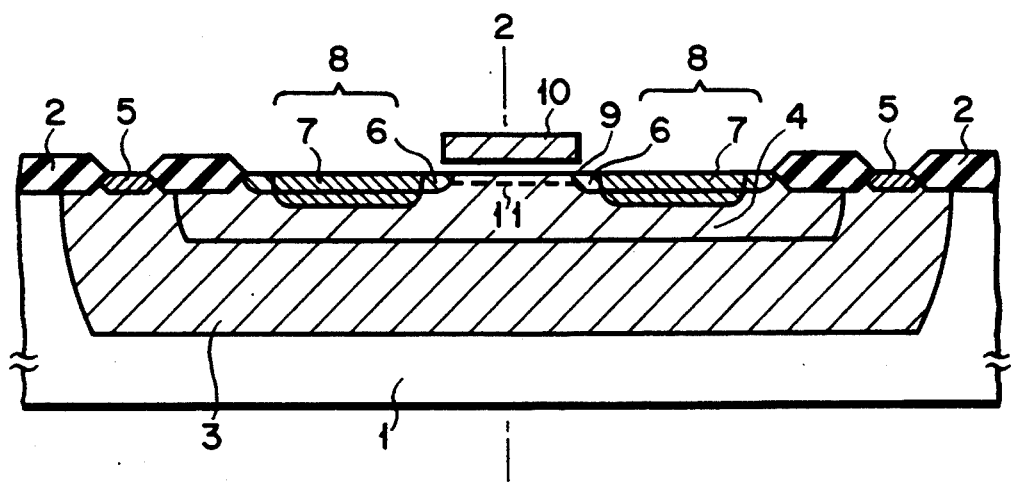
FIG. 1 is a cross sectional view schematically showing a MOSFET according to a first embodiment of this invention.

FIG. 1 is a cross sectional view schematically showing a high voltage MOSFET according to a first embodiment of this invention.

As shown in FIG. 1, a field oxide film 2 is formed on the surface area of an n-type silicon substrate 1, for example. A first p+-type well 3 is formed in the n-type substrate 1 by doping impurity into the n-type substrate 1 from the main surface thereof. The depth of the well is approx. 5 $\mu$m from the main surface. A second p-type well 4 is formed in the first p+-type well 3. The depth of the well is approx. 1 $\mu$m from the main surface. Further, n+-type source/drain regions 7 are formed in the surface area of the second p-type well 4. In addition, n−-type source/drain regions 6 of low impurity concentration are formed to surround the source/drain regions 7. That is, the MOSFET is formed with the LDD structure, and the regions 6 and 7 are combined to form source/drain regions 8. A gate oxide film 9 is formed on that portion of the second well 4 which lies between the source/drain regions 6 of low impurity concentration and a gate electrode 10 is formed on the gate oxide film 9. Further, in the surface area of the first well 3, a p++-type guard ring 5 of an impurity concentration higher than the impurity concentration of the first well 3 is formed. The guard ring 5 is formed in the surface area of the first well 3 to surround the well 4.

Figure 2:
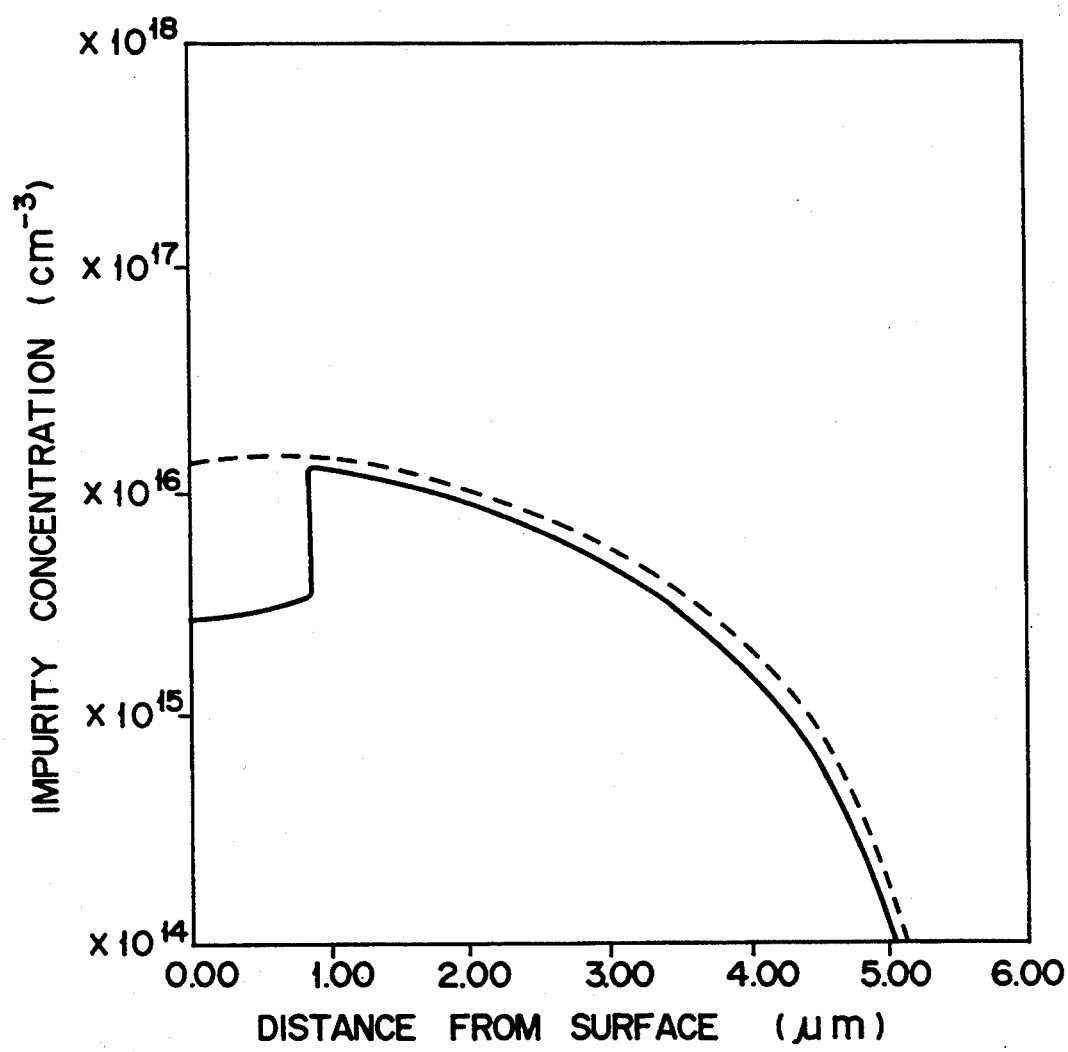
FIG. 2 is a diagram showing the impurity concentration profile in the cross section taken along the 2—2 line in FIG. 1.

FIG. 2 is a diagram showing the impurity concentration profile in the cross section taken along the 2—2 line in FIG. 1.

As shown in FIG. 2, the first p+-type well 3 is formed to the depth of approx. 5 $\mu$m from the main surface and the impurity concentration thereof near the main surface is approx. $1.5 \times 10^{16}$ cm$^{-3}$. Further, the second p-type well 4 is formed to the depth of approx. 1 $\mu$m from the main surface and the impurity concentration thereof near the main surface is approx. $3 \times 10^{15}$ cm$^{-3}$. As shown in FIG. 2, the impurity concentration of the second p-type well 4 varies along the depth direction and the impurity concentration of a portion thereof which lies in position deeper than 1 $\mu$m becomes exactly equal to that of the of the first p+-type well 3. This is because the second p-type well 4 is formed by doping impurity of the opposite conductivity type into the first p+-type well. That is, the second p-type well 4 is formed by reducing the impurity concentration of the main surface area of the first p+-type well 3.

According to the MOSFET with the above construction, since the n-type source/drain electrodes 8 are formed in the p-type well 4 having the low impurity concentration, the surface breakdown voltage between the n-type source/drain electrodes 8 and the p-type well 4 can be enhanced.

Since a current path extending from one of the regions 8 to the other region 8 via a channel 11 is formed in the p-type well 4 having the low impurity concentration, the intensity of the electric field near the gate can be reduced. Therefore, it becomes difficult for impact ionization multiplication to occur. As a result, it becomes difficult for a lateral parasitic bipolar transistor constructed by the n-type source 8, p-type well 4 and n-type drain 8 to be turned on. Further, since the p-type well 4 is surrounded by the p+-type well 3 having an impurity concentration higher than that of the p-type well 4, it becomes difficult for a vertical parasitic bipolar transistor constructed by the n-type source/drain 8, p-type wells 3 and 4, and n-type substrate 1 to be turned on. Judging from the above points, the latch-up resistant property can be enhanced.

Next, the improvement of the surface breakdown voltage between the n-type source/drain regions 8 and the p-type well 4 is explained.

Figure 3A:
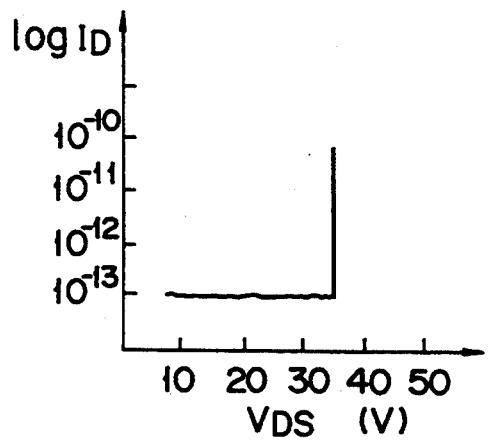
FIGS. 3A and 3B are diagrams showing the relation between a voltage between the drain and source of the conventional MOSFET and a drain current thereof.
Figure 4A:
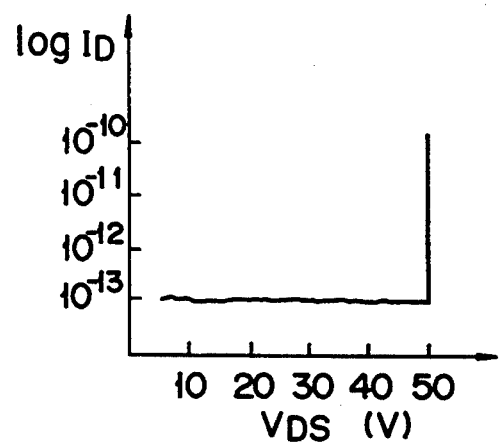
FIGS. 4A and 4B are diagrams showing the relation between a voltage between the drain and source of the MOSFET according to the first embodiment of this invention and a drain current thereof.

FIG. 3A is a diagram showing the relation between a drain current $I_D$ of the conventional MOSFET and a voltage $V_{DS}$ between the drain and source thereof, and FIG. 4A is a diagram showing the relation between a drain current $I_D$ of the MOSFET according to this invention and a voltage $V_{DS}$ between the drain and source thereof. The test was effected under a condition that no voltage was applied between the gate electrode and the substrate.

As shown in FIG. 3A, when a voltage of 30 to 35 V is applied between the drain and the source in the conventional MOSFET, the drain current $I_D$ starts to flow.

However, as shown in FIG. 4A, a voltage which causes the drain current $I_D$ to start flowing can be shifted to approx. 50 V in the MOSFET according to this invention.

Next, the improvement of the latch-up resistant property is explained.

Figure 3B:
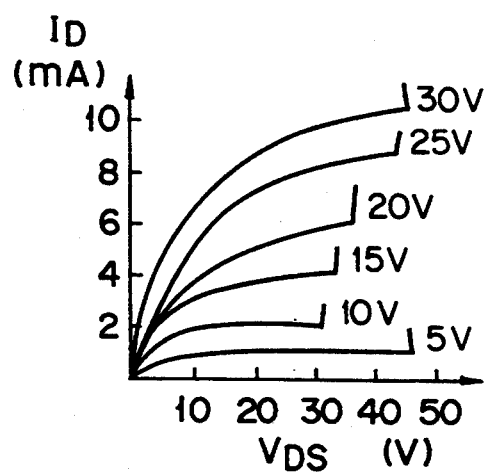
Figure 4B:
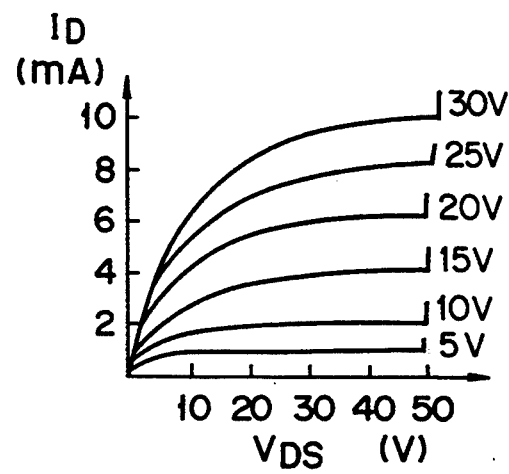

FIG. 3B is a diagram showing the relation between a drain current $I_D$ of the conventional MOSFET and a voltage $V_{DS}$ between the drain and source thereof, and FIG. 4B is a diagram showing the relation between a drain current $I_D$ of the MOSFET according to this invention and a voltage $V_{DS}$ between the drain and source thereof. The test was effected under a condition that a voltage was applied between the gate electrode and the substrate.

As shown in FIG. 3B, if a certain voltage is applied between the gate electrode and the substrate and when a voltage of 30 V or more is applied in the conventional MOSFET, the drain current $I_D$ starts to flow. Flow of the drain current $I_D$ means that a lateral parasitic bipolar transistor constructed by the n-type source 8, p-type well 4 and n-type drain 8 is turned on by the impact ionization multiplication. However, in the MOSFET of this invention, a voltage which causes the drain current $I_D$ to start flowing can be shifted to approx. 50 V irrespective of a voltage applied between the gate electrode and the substrate as shown in FIG. 4B.

From the above results, it is proved that the MOSFET of this invention is excellent in the withstanding voltage and the latch-up characteristic.

Further, in the MOSFET of this invention, for example, an operation voltage can be set at a high voltage of 10 V or more even when the element itself is miniaturized, and the problem caused by the latch-up phenomenon can be suppressed. For example, this type of MOSFET can be applied to the driver circuit for a liquid crystal display, the driver circuit for a printer head and the like.

Next, a method for manufacturing the MOSFET according to the first embodiment is explained.

FIGS. 5A to 5H are cross sectional views showing the MOSFET of the above first embodiment in a sequence of the steps for manufacturing the same. The explanation for the manufacturing method is made by considering a case wherein a MOSFET (which is hereinafter referred to as a high voltage element) according to this invention and a MOSFET (which is hereinafter referred to as a low voltage element) whose operation voltage is 5 V are formed on one substrate so as to make the manufacturing method closer to an actual IC manufacturing method.

Figure 5A:
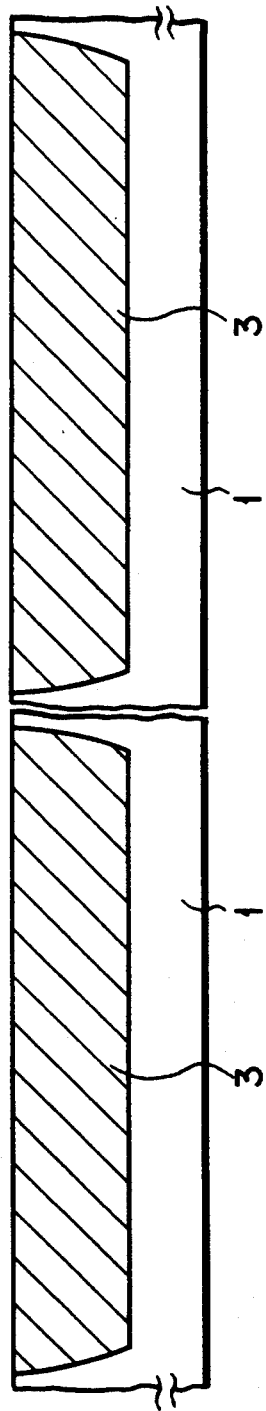

First, as shown in FIG. 5A, an oxide film (not shown) is formed on the n-type silicon substrate 1, for example, and then a photoresist (not shown) is formed by coating on the oxide film. Next, the photoresist is patterned into a pattern for formation of the p+-type well 3 and p-type impurity such as boron ion is ion-implanted into the substrate 1 with the photoresist used as a mask under a condition that the acceleration voltage is set at 100 KeV and the dose amount is set at $5 \times 10^{12}$ cm$^{-2}$. After this, a heat treatment is effected to diffuse and activate the boron ions in the substrate 1 so as to form the first p+-type well 3.

Figure 5B:
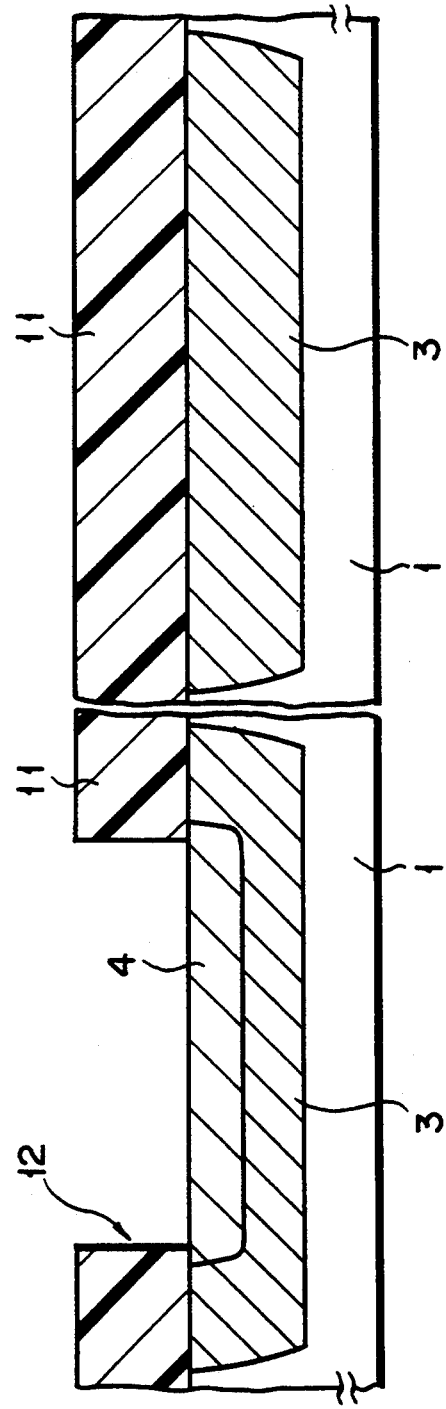

Next, as shown in FIG. 5B, a photoresist 11 is formed by coating on the substrate 1. Then, a window 12 is formed in the photoresist 11 by using the photo-etching process. The window 12 is formed over the first well 3. After this, for example, phosphorus ion is ion-implanted into the well 3 via the window 12 under a condition that the acceleration voltage is set at 280 KeV and the dose amount is set at $5 \times 10^{11}$ cm$^{-2}$. Next, the photoresist is removed and then a heat treatment is effected to diffuse the phosphorus ions into the well 3. At this time, after impurity of an opposite conductivity type, for example, phosphorus ion is diffused in the p+-type well 3, donors and acceptors are combined so as to partly lower the impurity concentration of the well 3. As a result, the second p-type well 4 is formed in the well 3.

Figure 5C:
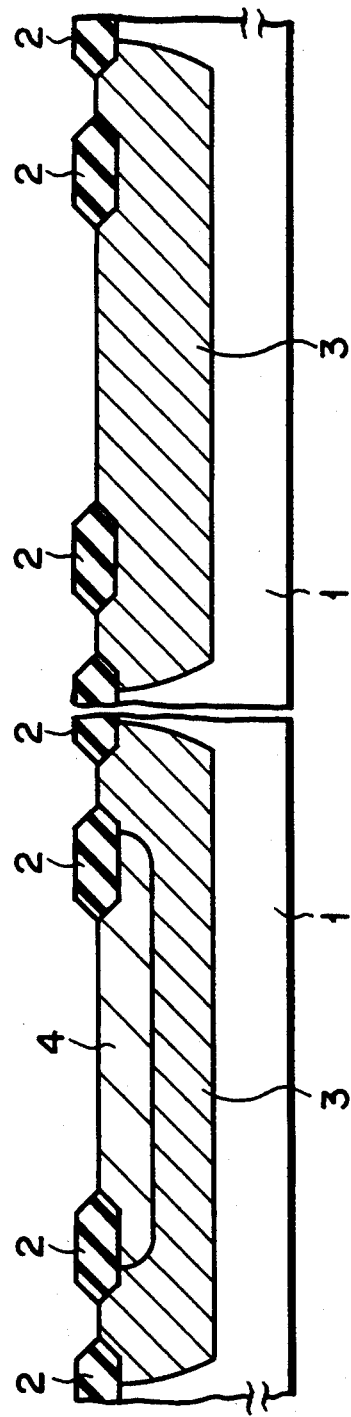

Next, as shown in FIG. 5C, a field oxide film 2 is formed by use of the LOCOS method, for example.

Figure 5D:
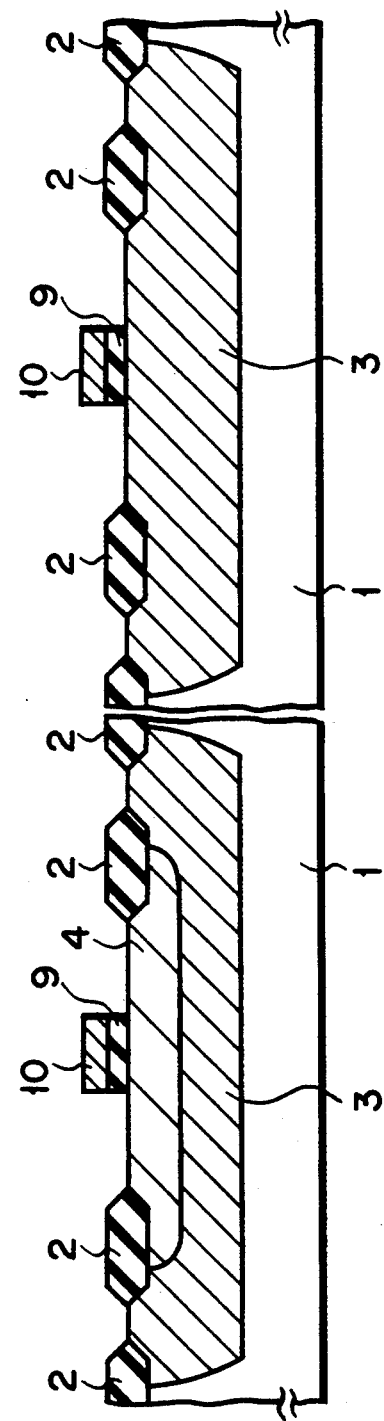

Next, as shown in FIG. 5D, an oxide film is formed on a silicon surface such as the surface of the substrate 1 by use of the thermal oxidation method, for example, and then a polysilicon film is formed on the resultant structure by use of the CVD method, for example. After this, a photoresist (not shown) is formed. Next, the photoresist is patterned into a gate electrode pattern by the photoetching process. Then, the polysilicon layer and the oxide film are sequentially etched to form the gate electrode 10 and gate oxide film 9 with the photoresist film used as a mask.

Next, as shown in FIG. 5E, a photoresist 21 is formed on the resultant structure. Then, a window 22 is formed in the photoresist 21 by using the photoetching process. The window 22 is formed over the well 4. After this, for example, phosphorus ion is ion-implanted into the well 4 via the window 22 under a condition that the acceleration voltage is set at 40 KeV and the dose amount is set at $3.5 \times 10^{12}$ cm$^{-2}$. Next, the photoresist 21 is removed and then a heat treatment is effected to diffuse the phosphorus ions into the well 4 and activate the same. As a result, the n$^-$-type source/drain regions 6 of low impurity concentration are formed in the well 4.

Next, as shown in FIG. 5F, a photoresist 31 is formed on the resultant structure. Then, windows 32 and 33 are formed in the photoresist 31 by using the photoetching process. The windows 32 are formed over the source/drain regions 6 of low impurity concentration and the window 33 is formed over the well 3. After this, for example, phosphorus ion is ion-implanted into the source/drain regions 6 of low impurity concentration and the well 3 via the windows 32 and 33 under a condition that the acceleration voltage is set at 40 KeV and the dose amount is set at $3.5 \times 10^{15}$ cm$^{-2}$. Next, the photoresist 31 is removed and then a heat treatment is effected to diffuse the phosphorus ions into the source/drain regions 6 of low impurity concentration and well 3 and activate the same. As a result, the n+-type source/drain regions 8 of the high voltage element are formed in the well 4 and the n+-type source/drain regions 13 are formed in the well 3.

Next, as shown in FIG. 5G, a photoresist 41 is formed on the resultant structure. Then, a window 42 is formed in the photoresist 41 by using the photoetching process. The windows 42 are formed over the well 3. After this, for example, boron ion is ion-implanted into the well 3 via the windows 42 under a condition that the acceleration voltage is set at 35 KeV and the dose amount is set at $2.0 \times 10^{15}$ cm$^{-2}$. Next, the photoresist 41 is removed and then a heat treatment is effected to diffuse the boron ions into the well 3. As a result, the p++-type guard ring 5 is formed in the surface area of the well 3.

Next, as shown in FIG. 5H, an inter-level insulation film 50 formed of a silicon oxide film, for example, is formed on the resultant structure by the CVD method, for example. Next, contact holes 51 reaching the n+- type source/drain regions 8 and 13 are formed in the inter-level insulation film 50. Then, for example, an aluminum layer is formed on the resultant structure by use of the sputtering method, for example. After this, the aluminum layer is patterned to form wirings 52.

Thus, the MOSFET according to the first embodiment of this invention can be completed by effecting the manufacturing method as described above.

According to the above manufacturing method, n-type impurity is ion-implanted and diffused into the first p+-type well 3 to partly lower the impurity concentration of the well 3. As a result, the second well 4 of low impurity concentration can be formed in the well 3.

Next, a MOSFET according to a second embodiment of this invention is explained.

Figure 6:
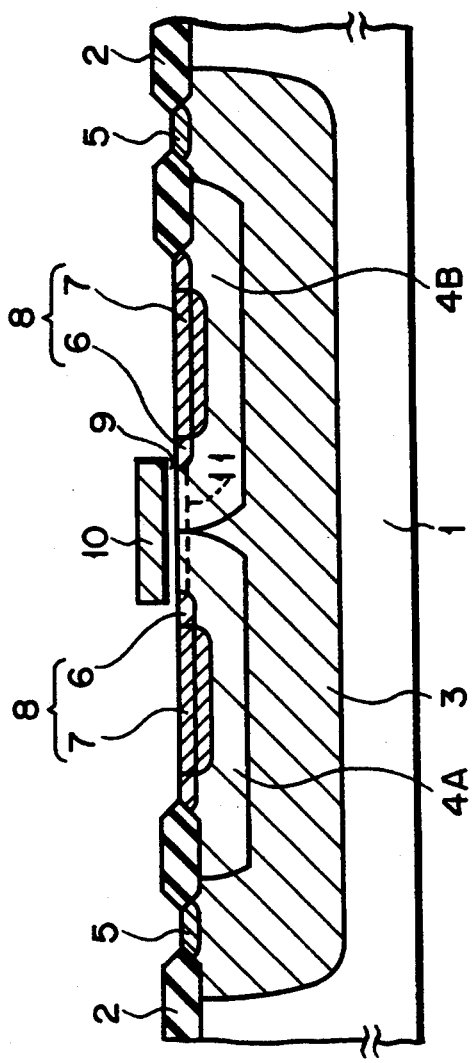
FIG. 6 is a cross sectional view schematically showing a MOSFET according to a first embodiment of this invention.

FIG. 6 is a cross sectional view schematically showing the MOSFET according to the second embodiment of this invention. In FIG. 6, portions which are the same as those of FIG. 1 are denoted by the same reference numerals and only different portions are explained here.

As shown in FIG. 6, the wells of low impurity concentration are formed in limited areas surrounding the source/drain regions 8 in the MOSFET according to the second embodiment. That is, second p-type well regions 4A and 4B are formed to respectively surround the source/drain regions 8.

In this embodiment, the impurity concentration of only portions surrounding the source/drain electrodes 8 is lowered by paying attention to the dependency of the withstanding voltage of the element on the size of a depletion layer formed around the source/drain regions 8.

As a result, a region of high impurity concentration, that is, the first p+-type well region 3 is enlarged in a range in which the withstanding voltage is not influenced, and the latch-up resistant property can be improved over the MOSFET shown in the first embodiment.

Next, a method of manufacturing the MOSFET of the second embodiment is explained.

Figure 7A:
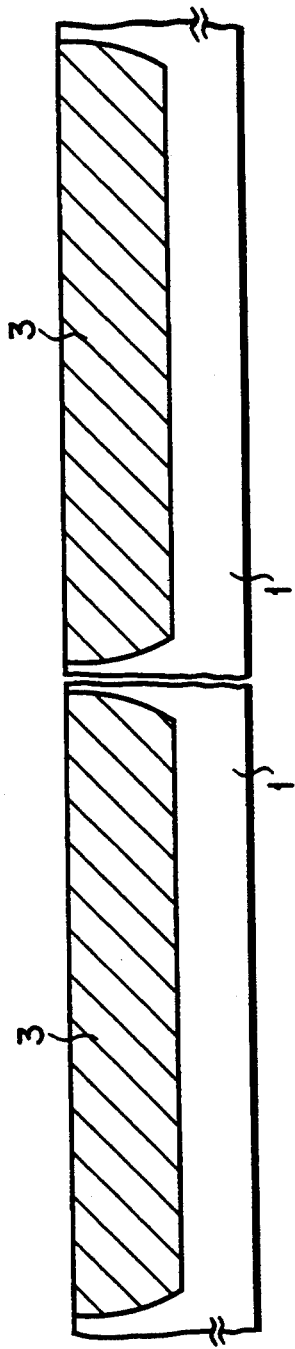
FIGS. 7A to 7C are cross sectional views showing a method of manufacturing the MOSFET according to the second embodiment of this invention.
Figure 7B:
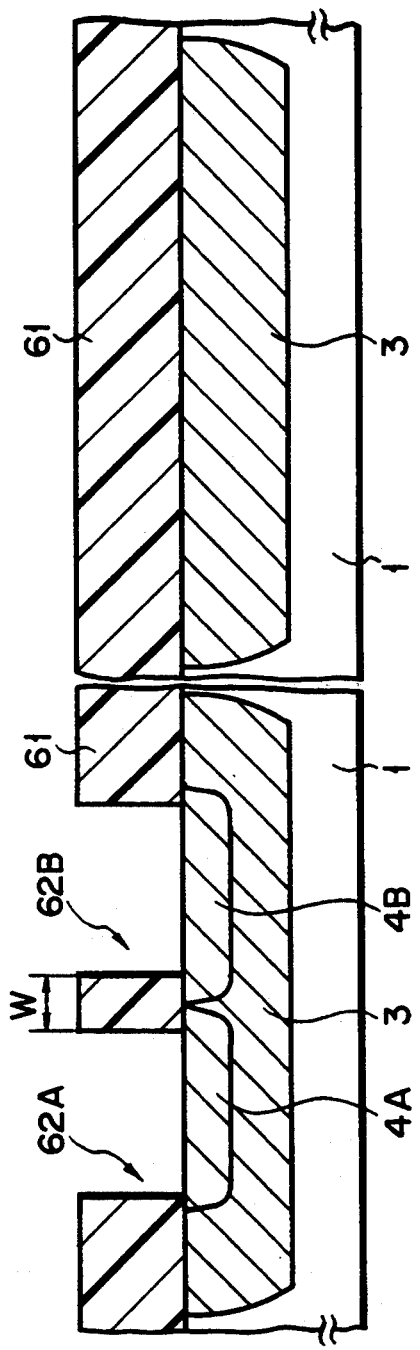
Figure 7C:
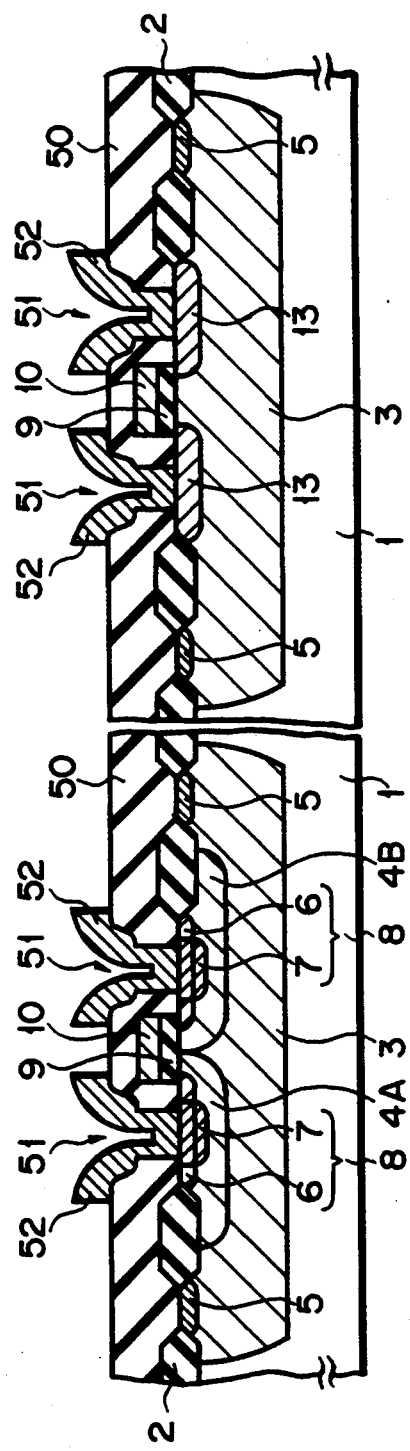

FIGS. 7A to 7C are cross sectional views showing the MOSFET of the above second embodiment in a sequence of the steps for manufacturing the same. The explanation for the manufacturing method is made by considering a case wherein a MOSFET according to this invention and a MOSFET whose operation voltage is 5 V are formed on one substrate so as to make the manufacturing method closer to an actual IC manufacturing method in the same manner as in the first embodiment.

First, as shown in FIG. 7A, the well 3 is formed in the substrate 1 in the same manner as described with reference to FIG. 5A.

Next, as shown in FIG. 7B, a photoresist 61 is formed by coating on the substrate 1. Then, windows 62A and 62B are formed in the photoresist 61 by the photoetching process. The windows 62A and 62B are formed over the well 3. After this, for example, phosphorus ion is ion-implanted into the well 3 via the windows 62A and 62B under a condition that the acceleration voltage is set at 280 KeV and the dose amount is set at $5 \times 10^{11}$ cm$^{-2}$. Next, the photoresist is removed and then the second p-type wells 4A and 4B having an impurity concentration lower than the well 3 are formed in the well 3 in the same manner as explained with reference to FIG. 5B.

In a case where the depth of the wells 4A and 4B from the main surface of the substrate 1 is approx. 1 μm, for example, the wells 4A and 4B can be formed without being superposed on each other if a distance W between the windows 62A and 62B is set to be longer than 1 μm, for example.

After this, as shown in FIG. 7C, a field oxide film 2 is formed on the surface area of the substrate 1 in the same manner as explained with reference to FIGS. 5C to 5H, for example. Then, a gate oxide film 9 is formed on the well 3 and a gate electrode 10 is formed on the gate oxide film 9. Next, source/drain regions 6 of low impurity concentration are formed in the wells 4A and 4B. After this, source/drain regions 7 are formed in the source/drain regions 6 of low impurity concentration and source/drain regions 13 are formed in the well 3. Then, a guard ring 5 is formed in the surface area of the well 3 and an inter-level insulation film 50 is formed to cover the substrate 1. Next, contact holes 51 reaching the source/drain regions 7 and 13 are formed in the inter-level insulation film 50 and then wirings 52 are formed on the inter-level insulation film 50.

Thus, the MOSFET of the second embodiment can be formed according to the manufacturing method described above.

In the first and second embodiments, the substrate 1 is of n-type and the first and second wells 3 and 4 are of p-type, but the conductivity type thereof can be inverted.

Further, it is also possible to form an n-type well in a p-type substrate, form a p-type well 3 of high impurity concentration explained in the first and second embodiments in the n-type well, and form a p-type well 4 of low impurity concentration in the well 3.

The impurity concentrations of the first and second wells 3 and 4 are not limited to the values defined in the embodiments and can be variously changed. Further, the depths of the first and second wells 3 and 4 from the main surface of the substrate can be variously modified.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, using a substrate of a first conductivity type, the method comprising the steps of:
   forming a heavily doped first well of a second conductivity type and a heavily doped second well of a second conductivity in the substrate;
   forming a first masking layer on the substrate, the first masking layer having a window exposing the heavily doped first well;
   introducing impurities of the first conductivity type into the heavily doped first well via the window of the first masking layer;
   removing the first masking layer;
   diffusing the impurities of the first conductivity type into the heavily doped first well, whereby a lightly doped well of the second conductivity type is provided in the heavily doped first well;
   forming a field insulating layer in a surface region of the substrate;
   forming a first gate insulating layer on a surface of the lightly doped well and a second gate insulating layer on a surface of the heavily doped second well;

forming a first gate electrode on the first gate insulating layer and a second gate electrode on the second gate insulating layer;

forming a second masking layer on the substrate, the second masking layer having a window exposing the lightly doped well and the first gate electrode layer;

introducing impurities of the first conductivity type into the lightly doped well via the window of the second masking layer;

removing the second masking layer;

diffusing the impurities of the first conductivity type into the lightly doped well, whereby a lightly doped source of the first conductivity type is provided in the lightly doped well and a lightly doped drain of the first conductivity type is provided in the lightly doped well;

forming a third masking layer on the substrate, the third masking layer having a first window exposing the heavily doped second well and the first gate electrode layer, a second window exposing the lightly doped source and a third window exposing the lightly doped drain;

introducing impurities of the first conductivity type into the heavily doped second well, the lightly doped source and the lightly doped drain via windows of the third masking layer;

removing the third masking layer; and diffusing the impurities of the first conductivity type into the heavily doped second well, the lightly doped source and the lightly doped drain, whereby a heavily doped source of the first conductivity type is provided in the heavily doped second well and a heavily doped drain of the first conductivity type is provided in the heavily doped second well, a heavily doped source of the first conductivity type is provided in the lightly doped source, a heavily doped drain of the first conductivity type is provided in the lightly doped drain.

2. A method according to claim 1, wherein the step of forming the lightly doped well includes the substep of bonding donors with acceptors.

3. A method according to claim 2, wherein the steps of introducing impurities each include a substep of ion implanting.

4. A method according to claim 3, wherein the step of forming heavily doped first and second wells includes the substep of using boron, and the steps of introducing impurities of the first conductivity type each include a substep of introducing phosphorous.

5. A method according to claim 1, wherein the last-recited diffusing step includes the substep of forming an insulated-gate FET, on the lightly doped well, including a high voltage element and forming an insulated-gate FET, on the heavily doped second well, including a low voltage element.

6. A method according to claim 5, wherein the last-recited diffusing step further includes the substep of forming the insulated-gate FET, on the lightly doped well, to be operated by 10 V or more and forming the insulated-gate FET, on the heavily doped second well, to be operated by 5 V.

* * * * *

UNITED STATES PATENT AND TRADEMARK OFFICE
CERTIFICATE OF CORRECTION

PATENT NO. : 5,420,062
DATED : May 30, 1995
INVENTOR(S) : Nakafumi INADA et al

It is certified that error appears in the above-indentified patent and that said Letters Patent is hereby corrected as shown below:

On the title page: Item [75]     inventor
"Nakfumi Inada" should read -- Nakafumi Inada --.

Signed and Sealed this

Twenty-sixth Day of September, 1995

*Attest:*

BRUCE LEHMAN

*Attesting Officer*     *Commissioner of Patents and Trademarks*